US008242692B2

(12) United States Patent
Kim et al.

(10) Patent No.: US 8,242,692 B2
(45) Date of Patent: Aug. 14, 2012

(54) ORGANIC LIGHT EMITTING DIODE DISPLAY AND METHOD FOR MANUFACTURING THE SAME

(75) Inventors: Eun-Ah Kim, Gyeonggi-do (KR); Hee-Chul Jeon, Gyeonggi-do (KR); Woo-Suk Jung, Gyeonggi-do (KR); Hee-Seong Jeong, Gyeonggi-do (KR); Joo-Hwa Lee, Gyeonggi-do (KR); Chul-Woo Jeong, Gyeonggi-do (KR); Noh-Min Kwak, Gyeonggi-do (KR); Soon-Ryong Park, Gyeonggi-do (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 104 days.

(21) Appl. No.: 12/544,531

(22) Filed: Aug. 20, 2009

(65) Prior Publication Data
US 2010/0044692 A1 Feb. 25, 2010

(30) Foreign Application Priority Data
Aug. 20, 2008 (KR) ........................ 10-2008-0081403

(51) Int. Cl.
H01J 1/62 (2006.01)
H01J 63/04 (2006.01)

(52) U.S. Cl. ............ 313/507; 313/506; 438/29; 438/60; 438/99; 257/40; 257/72; 257/E51.005

(58) Field of Classification Search .................... 313/507
See application file for complete search history.

(56) References Cited

U.S. PATENT DOCUMENTS

| | | | |
|---|---|---|---|
| 7,023,508 B2 * | 4/2006 | You | 349/113 |
| 7,528,543 B2 * | 5/2009 | Wang et al. | 313/504 |
| 8,098,008 B2 * | 1/2012 | Kim et al. | 313/504 |
| 2004/0135501 A1 * | 7/2004 | Nishikawa | 313/506 |
| 2005/0030258 A1 * | 2/2005 | Satake | 345/55 |
| 2005/0140869 A1 * | 6/2005 | Yang et al. | 349/114 |
| 2005/0263757 A1 * | 12/2005 | Lee | 257/40 |
| 2007/0019137 A1 * | 1/2007 | Kim et al. | 349/114 |
| 2007/0128540 A1 * | 6/2007 | Noh et al. | 430/270.1 |
| 2010/0052519 A1 * | 3/2010 | Jeon et al. | 313/504 |
| 2010/0171106 A1 * | 7/2010 | Jung et al. | 257/40 |
| 2010/0171107 A1 * | 7/2010 | Jung et al. | 257/40 |
| 2010/0171419 A1 * | 7/2010 | Kim et al. | 313/505 |

FOREIGN PATENT DOCUMENTS

| | | |
|---|---|---|
| JP | 2003-282260 A | 10/2003 |
| JP | 2007-149527 A | 6/2007 |
| KR | 10-2008-0037192 A | 4/2008 |

* cited by examiner

*Primary Examiner* — N Drew Richards
*Assistant Examiner* — John P Dulka
(74) *Attorney, Agent, or Firm* — Knobbe, Martens, Olson & Bear LLP (57) ABSTRACT

The present invention relates to an organic light emitting diode (OLED) display and a manufacturing method thereof. The OLED display includes a substrate member that includes a plurality of pixel areas. A thin film transistor (TFT) is formed on the substrate member and includes a gate electrode, a source electrode, and a drain electrode. A planarization layer is formed on the TFT and includes a contact hole through which the drain electrode is partially exposed. A pixel electrode is formed on the planarization layer and is connected to the drain electrode of the TFT through the contact hole. A pixel defining layer is formed on the planarization layer and has a through opening. Light scattering spacers are formed on the pixel defining layer to scatter reflected light and may have various shapes and dimensions.

13 Claims, 6 Drawing Sheets

ORGANIC LIGHT EMITTING DIODE DISPLAY AND METHOD FOR MANUFACTURING THE SAME

CROSS-REFERENCE TO RELATED APPLICATIONS

This application claims priority to and the benefit of Korean Patent Application No. 10-2008-0081403 filed in the Korean Intellectual Property Office on Aug. 20, 2008, the entire contents of which are incorporated herein by reference.

BACKGROUND

1. Field

The present invention relates to an organic light emitting diode (OLED) display and a manufacturing method thereof. More particularly, the present invention relates to an OLED display with improved visibility by suppressing reflection of external light, and a manufacturing method thereof.

2. Description of the Related Art

An OLED display includes a plurality of organic light emitting diodes (OLEDs). OLEDS typically include hole injection electrodes, an organic light emission layer, and electron injection electrodes. Light is emitted as excitons are generated in the organic light emission layer. The excitons are generated as electrons and holes are combined and drop from an excited state to a ground state. The OLED display displays an image by using the light resulting from these excitons.

Accordingly, an OLED display has self-luminance characteristics, and unlike a liquid crystal display (LCD), the thickness and weight thereof can be reduced since a separate light resource is not required. OLED displays are thus used in various applications, such as displays in mobile electronic devices, because OLED displays have low power consumption, high luminance, and high reaction speed.

However, the electrodes and other metal wires in the OLED display can reflect external light, such as ambient light. Unfortunately, this reflection of external light can deteriorate an OLED's display characteristics, such as black color expression and contrast.

The above information disclosed in this Background section is only for enhancement of understanding. Therefore, it may contain information that does not form the prior art that is already known in this country to a person of ordinary skill in the art.

SUMMARY

Embodiments of the present invention can provide an organic light emitting diode (OLED) display having improved visibility by suppressing reflection of external light, such as ambient light. Furthermore, embodiments of the present invention provide a manufacturing method for an OLED display.

An exemplary OLED display according to an embodiment of the present invention includes: a substrate member including a plurality of pixel areas; a thin film transistor (TFT) including a gate electrode, a source electrode, and a drain electrode and formed on the substrate member; a planarization layer formed on the TFT and having a contact hole through which the drain electrode is partially exposed; a pixel electrode formed on the planarization layer, and connected to the drain electrode of the TFT through the contact hole; a pixel defining layer formed on the planarization layer and having an opening therethrough; and a light scattering spacer formed on the pixel defining layer. Each pixel area includes one pixel electrode and a plurality of light scattering spacers.

The OLED display may further include a conductive layer that is formed on the same layer as at least one of the gate electrode, the source electrode, and the pixel electrode with the same material thereof. At least a part of the conductive layer may be disposed under the light scattering spacer.

The light scattering spacer may be shaped as a frustum of a pyramid, a prism, a truncated circular cone, a cylinder, a hemisphere, and a hemispheroid. The plurality of light scattering spacers may also be irregularly disposed in each pixel area. A ratio of the entire bottom dimension of the light scattering spacers to each pixel area may be greater than 30% of a ratio of an area of the pixel defining layer to the pixel area. A bottom dimension of one light scattering spacer may range between 1% to 20% of the ratio of the area of the pixel defining layer to the pixel area.

The OLED display may further include a sealing member disposed facing the substrate member with the thin film transistor interposed therebetween. The light scattering spacer may maintain a distance between the substrate member and the sealing member. The light scattering spacer may be integrally formed with the pixel defining layer and may be formed with the same material as the pixel defining layer.

An exemplary manufacturing method of an OLED display according to another embodiment of the present invention includes: forming a thin film transistor (TFT) that includes a gate electrode, a source electrode, and a drain electrode on a substrate member that includes a plurality of pixel areas; forming a planarization layer that covers the TFT and has a contact hole through which the drain electrode is partially exposed; forming a pixel electrode connected to the drain electrode of the TFT through the contact hole on the planarization layer; coating a photo-sensitive material layer on the planarization layer and the pixel electrode; and forming a pixel defining layer by patterning the photo-sensitive material layer with a photolithography process using a mask on the planarization layer and simultaneously forming a light scattering spacer on the pixel defining layer, the pixel defining layer having an opening through which the pixel electrode is exposed. Each of the respective pixel areas includes one pixel electrode and a plurality of light scattering spacers. The photolithography process may include a half-tone exposure process.

DETAILED DESCRIPTION OF SOME EMBODIMENTS

The present invention will now be described with reference to the accompanying drawings, in which exemplary embodiments of the invention are shown. Those skilled in the art will realize that the described embodiments may be modified in various different ways, all without departing from the spirit or scope of the present invention. Constituent elements having the same configuration are representatively described with reference to one or more embodiments. Other exemplary embodiments may then be described by referring to various differences between the embodiments.

The drawings and description are to be regarded as illustrative in nature and not restrictive. Like reference numerals designate like elements throughout the specification.

In the drawings, the thickness of layers, films, panels, regions, etc., may be exaggerated for clarity. For example, it should be understood that when an element, such as a layer, film, region, or substrate is referred to as being "on" another element, it can be directly on the other element or intervening elements may also be present. When an element is referred to as being "directly on" another element, there are no intervening elements present. In addition, the size and the thickness of each element in the drawing are provided for better understanding and ease of description of various embodiments and are not intended to limit the present invention.

In the accompanying drawings, an organic light emitting diode (OLED) display is illustrated. For purposes of illustration, an active matrix (AM)-type OLED display is shown having a 2Tr-1Cap structure in which two thin film transistors (TFTs) and one capacitor are formed in one pixel. But, the embodiments of the present invention are not limited thereto. Other OLED display embodiments consistent with the present invention can have various structures. For example, three or more TFTs and two or more capacitors can be provided in one pixel of an OLED display, and separate wires can be further provided in the OLED display.

One skilled in the art will recognize that the term pixel can refer to a minimum unit for displaying an image. An OLED display displays an image by using a plurality of pixels, and thus, has a plurality of pixel areas.

Figure 1:
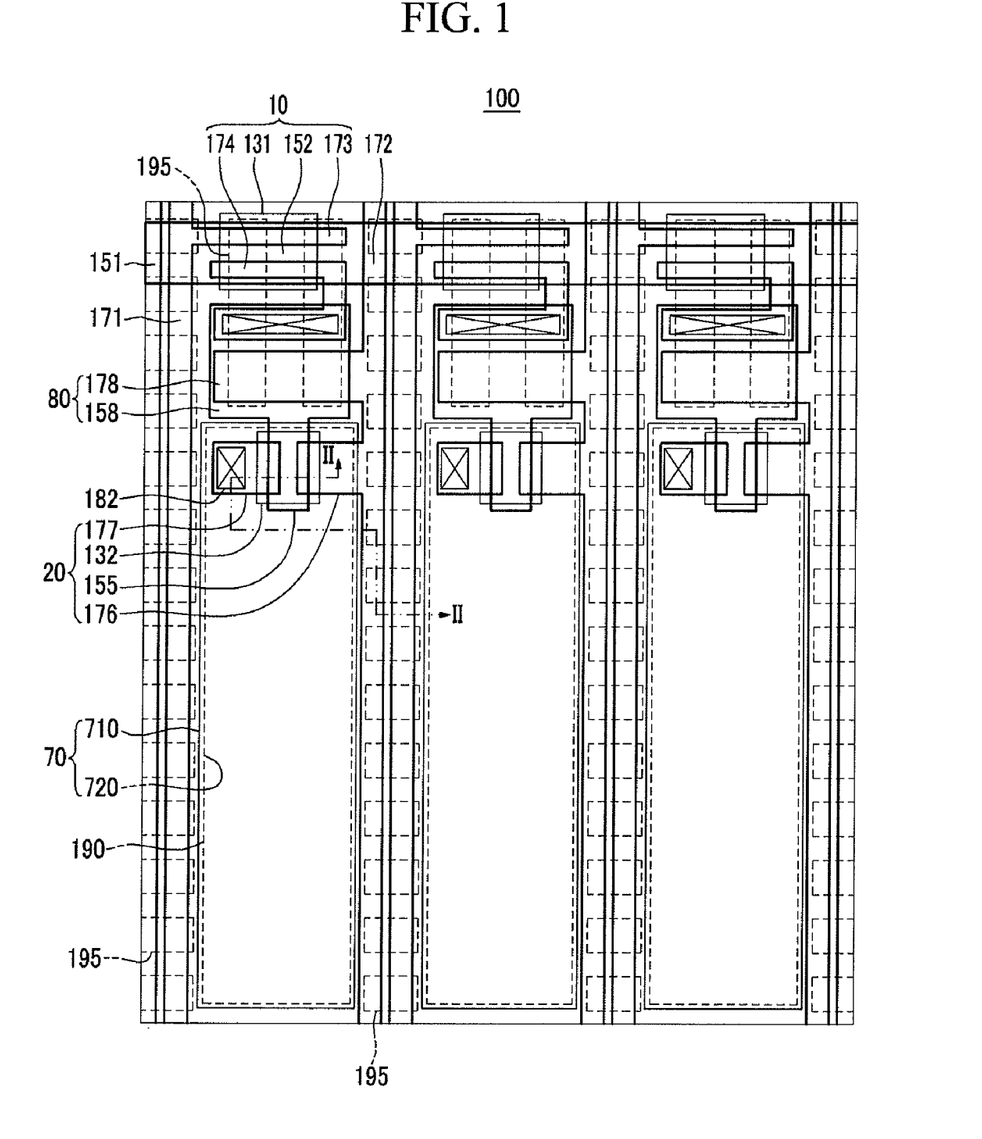
FIG. 1 is a layout view of an organic light emitting diode (OLED) display according to a first exemplary embodiment of the present invention.

Exemplary embodiments of the present invention will now be described with reference to FIG. 1 and FIG. 2. As shown in FIG. 1, an organic light emitting diode (OLED) display 100 includes a switching thin film transistor 10, a driving thin film transistor 20, an OLED 70, and a capacitor 80. In addition, the OLED display 100 can further include a gate line 151 aligned in one direction, a data line 171 and a common power line 172. The data line and common power line 172 respectively cross the gate line 151 to be insulated therefrom. In the example shown, the boundary of one pixel area may be defined by the gate line 151, the data line 171, and the common power line 172.

The switching thin film transistor 10 is used as a switch for selecting a pixel to be light-emitted. The switching thin film transistor 10 includes a switching semiconductor layer 131, a switching gate electrode 152, a switching source electrode 173, and a switching drain electrode 174. The switching gate electrode 152 is connected to the gate line 151. The switching source electrode 173 is connected to the data line 171. The switching drain electrode 174 is disposed at a distance from the switching source electrode 173, and is connected to the first sustain electrode 158.

The driving thin film transistor 20 applies driving power for light emission of an organic emission layer 720 of an OLED 70 in the selected pixel to the pixel electrode 710. The driving thin film transistor 20 can include a driving semiconductor layer 132, a driving gate electrode 155, a driving source electrode 176, and a driving drain electrode 177. The driving gate electrode 155 is connected to the first sustain electrode 158. The driving source electrode 176 and the second sustain electrode 178 are respectively connected to the common power line 172. The driving drain electrode 177 is connected to the pixel electrode 710 of the OLED 70 through a contact hole 182.

The OLED 70 includes a pixel electrode 710, an organic emission layer 720 formed on the pixel electrode 710, and a common electrode 730 (also shown in FIG. 2), which is formed on the organic emission layer 720. Here, the pixel electrode 710 is a positive (+) electrode, which is a hole injection electrode, and the common electrode 730 is a negative (−) electrode, which is an electron injection electrode. However, the present invention is not limited to this configuration. For example, the pixel electrode 710 may be the negative electrode and the common electrode 730 may be the positive electrode.

Holes and electrodes are injected into the organic emission layer 720 respectively from the pixel electrode 710 and the common electrode 730. Light is then emitted from the OLED 70 when holes and electrons drop from an excited state to a base state and generate excitons.

The capacitor 80 includes a first sustain electrode 158 and a second sustain electrode 178 that are disposed with a gate insulation layer 140 (also shown in FIG. 2) that is interposed therebetween. With the above-described structure, the switching thin film transistor 10 can be driven to transmit a data voltage applied to the data line 171 to the driving thin film transistor 20 by a gate voltage applied to the gate line 151. The capacitor 80 stores a voltage that corresponds to a voltage difference between a common voltage transmitted from the common power line 172 to the driving thin film transistor 20 and the data voltage transmitted from the switching thin film transistor 10. A current corresponding to the voltage stored in the capacitor 80 flows to the OLED 70 through the driving thin film transistor 20 so that OLED 70 emits light.

The OLED display 100 may further include a pixel defining layer 190 and a light scattering spacer 195. The pixel defining layer 190 includes an opening through which the pixel electrode 710 is exposed. The organic emission layer 720 is substantially disposed in the opening of the pixel defining layer 190. That is, a portion in which the pixel defining layer 190 is formed is substantially equivalent to other portions, excluding a portion where the pixel electrode 710 is formed.

The light scattering spacer 195 is formed on the pixel defining layer 190. In one embodiment, the light scattering spacer 195 is integrally formed with the pixel defining layer 190 by using a material that is the same as that the pixel defining layer 190. For example, the pixel defining layer 190 and the light scattering spacer 195 can be formed together by controlling the amount of exposure through a half-tone exposure process. However, the present invention is not limited to this process. For example, the pixel defining layer 190 and the light scattering spacer 195 may be sequentially formed, and they can be respectively made of different materials. In some embodiments, one pixel electrode 710 and a plurality of light scattering spacers 195 are provided in each pixel area.

As shown in FIG. 1, the light scattering spacer 195 is overlapped with at least a part of a conductive layer formed on the same layer with the same material together with at least one of gate electrodes 152 and 155, source electrodes 173 and 176, drain electrodes 174 and 177, and a pixel electrode 710. Here, the conductive layer includes the gate line 151, the data line 171, the common power line 172, the first sustain electrode 158, and the second sustain electrode 178. That is, at least a part of at least one of the gate line 151, the data line 171, the common power line 172, the first sustain electrode 158, and the second sustain electrode 178 may be disposed under the light scattering spacer 195.

In addition, the light scattering spacers 195 disposed in one pixel area may have the same bottom dimension or different bottom dimensions. For example, various light scattering spacers 195 may have various bottom dimensions.

The light scattering spacer 195 scatters external light reflected to the conductive layer disposed thereunder and may suppress reflection of external light, such as ambient light. Therefore, the OLED display 100 may have improved visibility and performance.

In some embodiments, the ratio of the entire bottom dimension of light scattering spacers 195 to one pixel area is greater than 30% of a ratio of an area of the pixel defining layer 190 to the pixel area. In addition a bottom dimension of one light scattering spacer 195 may range approximately from 1% to 20% of the ratio of the area of the pixel defining layer 190 to the pixel area.

When the bottom dimension of the light scattering spacer 195 is less than 30%, a sufficient light scattering effect is not expected. However, if the bottom dimension of the light scattering spacer 195 is decreased, consistency and surface roughness may be increased so that the light scattering effect is enhanced. On the other hand, if the bottom dimension is too small, the light scattering spacer 195 may not function as a spacer.

Figure 2:
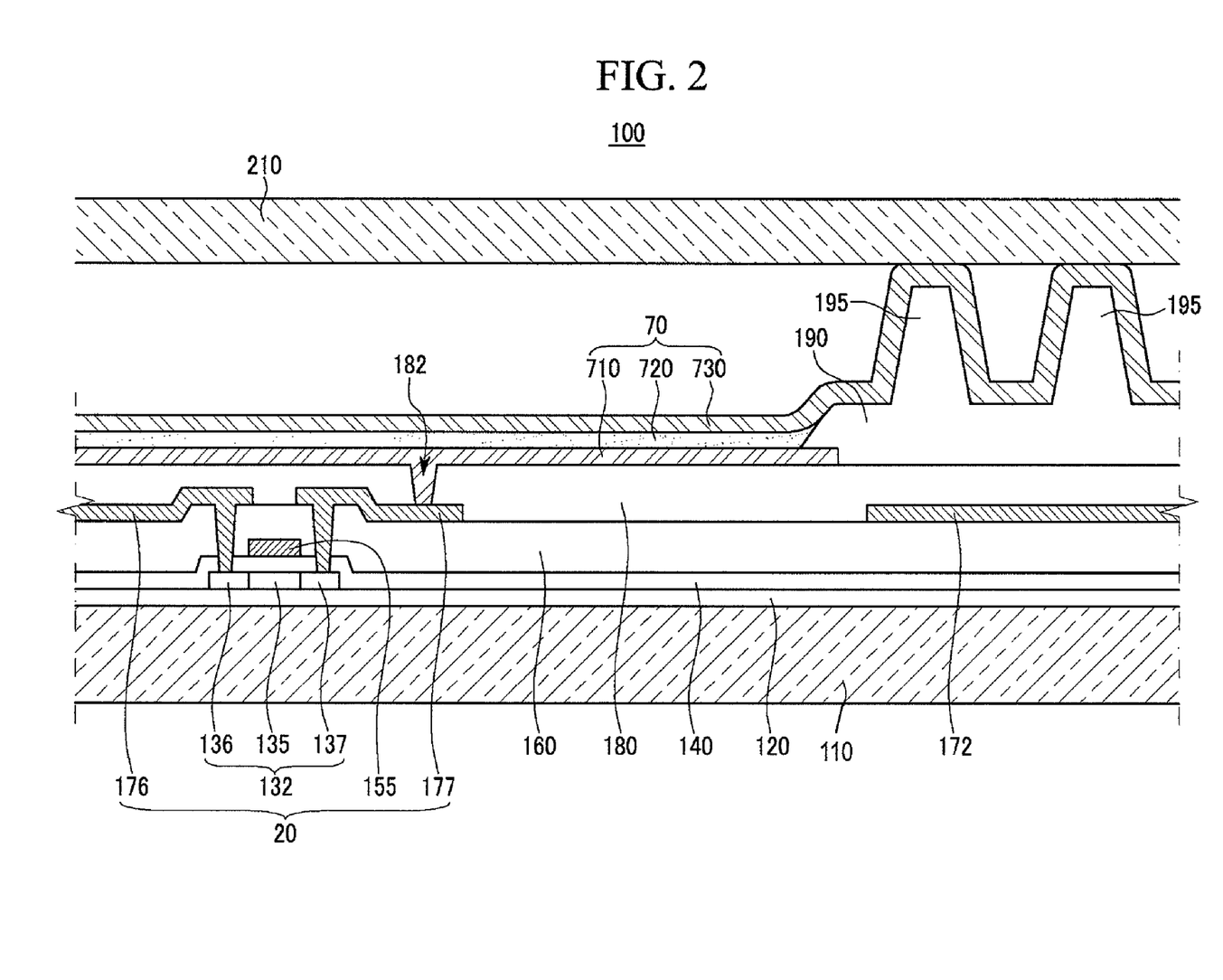
FIG. 2 is a cross-sectional view of FIG. 1, taken along the line II-II.

Reference will now be made to FIG. 2. FIG. 2 shows an OLED display 100, the driving thin film transistor 20, the organic light emitting element 70, and the capacitor 80. With the above-described configuration, the OLED display 100 can have improved visibility by suppressing reflection of external light.

Certain features of the switching thin film transistor 10 may be described to illustrate some differences from the driving thin film transistor 20. For example, the switching thin film transistor 10 (not shown in FIG. 2) may be a polycrystalline thin film transistor or an amorphous thin film transistor that includes an amorphous silicon layer.

The driving film transistor 20 may be a polycrystalline thin film transistor that includes a polysilicon layer. In an embodiment, the driving thin file transistor 20 may be a PMOS-structured thin film transistor with a P-type impurity. One skilled in the art will recognize that other types of thin film transistors may be employed in the embodiments. For example, the driving thin file transistor 20 may be a NMOS-structured thin film transistor or a CMOS-structure thin film transistor. The configuration of the driving thin film transistor 20 is thus not limited to the above-described embodiment. One skilled in the art will recognize that the driving thin file transistor 20 may be modified in various ways.

As shown in FIG. 2, a substrate member 110 is formed as an insulation substrate and may be made of glass, quartz, ceramic, plastic, etc. However, the present invention is not limited to these materials. For example, the substrate member 110 can be formed from a metal, such as stainless steel.

The substrate member 110 can include a plurality of pixel areas. For example, the substrate member 110 may include a pixel area partitioned into a plurality of areas. A pixel electrode 710 and a plurality of light scattering spacers 195 may be disposed in each pixel area.

A buffer layer 120 is formed on the substrate member 110. The buffer layer 120 prevents impurities from permeating the substrate member 110. The buffer layer 120 may also serve as a planarization surface for the substrate member 110. The buffer layer 120 can be made of various materials. For example, the buffer layer 120 can be made of one of a silicon nitride (SiNx) layer, a silicon dioxide ($SiO_2$) layer, and a silicon oxynitride (SiOxNy) layer. However, the buffer layer 120 is not always necessary and, in some embodiments, may be omitted based on the type and process conditions of the substrate member 110.

A driving semiconductor 132 is formed on the driving buffer layer 120. The driving semiconductor layer 132 may be formed with a polysilicon layer. The driving semiconductor layer 132 can include a channel region 135 that is not doped. The driving semiconductor layer 132 may further include a source region 136 and a drain region 137 that are doped with p+ impurities at respective sides of the channel region 135. The doped ion material may be a P-type impurity, such as boron (B) material like $B_2H_6$. The impurities used may change in accordance with the type of the thin film transistor employed. The gate insulation layer 140 made of silicon nitride (SiNx) or silicon dioxide ($SiO_2$) is formed on the driving semiconductor layer 132. A gate wire including the driving gate electrode 155 is formed on the gate insulating layer 140. The gate wire further includes the gate line 151 (shown in FIG. 1), the first sustain electrode 158 (shown in FIG. 1), and other wires. In addition, the driving gate electrode 155 is formed to overlap at least a part of the driving semiconductor layer 132, and particularly, is formed to overlap the channel region 135.

An interlayer insulation layer 160 that covers the driving gate electrode 155 is formed on the gate insulating layer 140. The gate insulating layer 140 and the interlayer insulating layer 160 share through-holes exposing the source region 136 and the drain region 137 of the driving semiconductor layer 132. Like the gate insulation layer 140, the interlayer insulating layer 160 is made of silicon nitride (SiNx) or silicon dioxide ($SiO_2$).

A data wire including the driving source electrode 176 and the driving drain electrode 177 is formed on the interlayer insulating layer 160. The data wire further includes the data line (171 of FIG. 1), the common power line 172, the second sustain electrode (178 of FIG. 1), and other wires. In addition, the driving source electrode 176 and the driving drain electrode 177 are respectively connected to the source region 136 and the drain region 137 of the driving semiconductor layer 132 through the through-holes.

As described, the driving thin film transistor 20 including the driving semiconductor layer 132, the gate electrode 155, the driving source electrode 176, and the driving drain electrode 177 is formed. A planarization layer 180 that covers the data wires 172, 176, 177, and 178 is formed on the interlayer insulating layer 160. The planarization layer 180 removes steps and performs planarization in order to increase luminous efficiency of the OLED 70. In addition, the planarization layer 180 has a contact hole 182 through which the drain electrode 177 is partially exposed.

The planarization layer 180 can be made of at least one of polyacrylates resin, epoxy resin, phenolic resin, polyamide resin, polyimide resin, unsaturated polyesters resin, poly phenylenethers resin, poly phenylenesulfide resin, and benzocyclobutene (BCB). The pixel electrode 710 of the OLED 70 is formed on the planarization layer 180. The pixel electrode 710 is connected to the drain electrode 177 through the contact hole 182 of the planarization layer 180.

In addition, a pixel defining layer 190 having an opening that exposes the pixel electrode 710 is formed on the planarization layer 180. The pixel electrode 710 may be disposed at a location corresponding to the opening of the pixel defining layer 190. The pixel defining layer 190 can be made of an inorganic material like a resin or silica group, such as polyacrylate resin and polyimide.

The light scattering spacer 195 is formed on the pixel defining layer 190. The light scattering spacer 195 may be made together with the pixel defining layer 190 and may be made of substantially the same material as the pixel defining layer 190. In addition, the light scattering spacer 195 may be disposed on a light-reflective metal wire at various locations, such as on the gate line (151 of FIG. 1), the data line (171 of FIG. 1), the common power line 172, the first sustain electrode (158 of FIG. 1), and the second sustain electrode (178 of FIG. 1).

The light scattering spacer 195 scatters external light reflected by a metal wire and may also help maintain the distance between the substrate member 110 and the sealing member 210 facing the substrate member 110. The sealing member 210 covers the thin film transistors 10 and 20 and the OLED 70 formed on the substrate member 110. The sealing member 210 may be used to protect these components from external environmental conditions, such as temperature variations, moisture, etc.

The light scattering spacer 195 may have various shapes in order promote the scattering of external light. For example, the light scattering spacer 195 may be shaped as a frustum of a pyramid, a prism, a truncated circular cone, and a cylinder. One skilled in the art will recognize that light scattering spacer 195 may employ one or more other shapes.

As noted previously, the OLED 70 may generally include the pixel electrode 710, the organic emission layer 720, and the common electrode 730. The organic emission layer 720 is formed on the pixel electrode 710 in the opening of the pixel defining layer 190. The common electrode 730 is formed on the pixel defining layer 190 and the organic emission layer 720. One of the pixel electrode 710 and the common electrode 730 can be made of a transparent conductive material, and the other can be made of a transflective or reflective conductive material. Depending on the configuration of the pixel electrode 710 and the common electrode 730, the OLED display 100 can be classified as a top light emitting type, a bottom light emitting type, or a dual-side light emitting type. For purposes of illustration, the OLED display 100 is shown as a top light emitting type of OLED display. However, one skilled in the art will recognize how OLED display 100 may be any type of OLED display configuration. However, one skilled in the art will recognize how OLED display 100 may be any type of OLED display configuration.

For the transparent conductive material, indium tin oxide (ITO), indium zinc oxide (IZO), zinc oxide (ZnO), or indium oxide ($In_2O_3$) can be used. For the reflective material, lithium (Li), calcium (Ca), fluorinated lithium/calcium (LiF/Ca), fluorinated lithium/aluminum (LiF/Al), aluminum (Al), silver (Ag), magnesium (Mg), or gold (Au) can be used.

Figure 3:
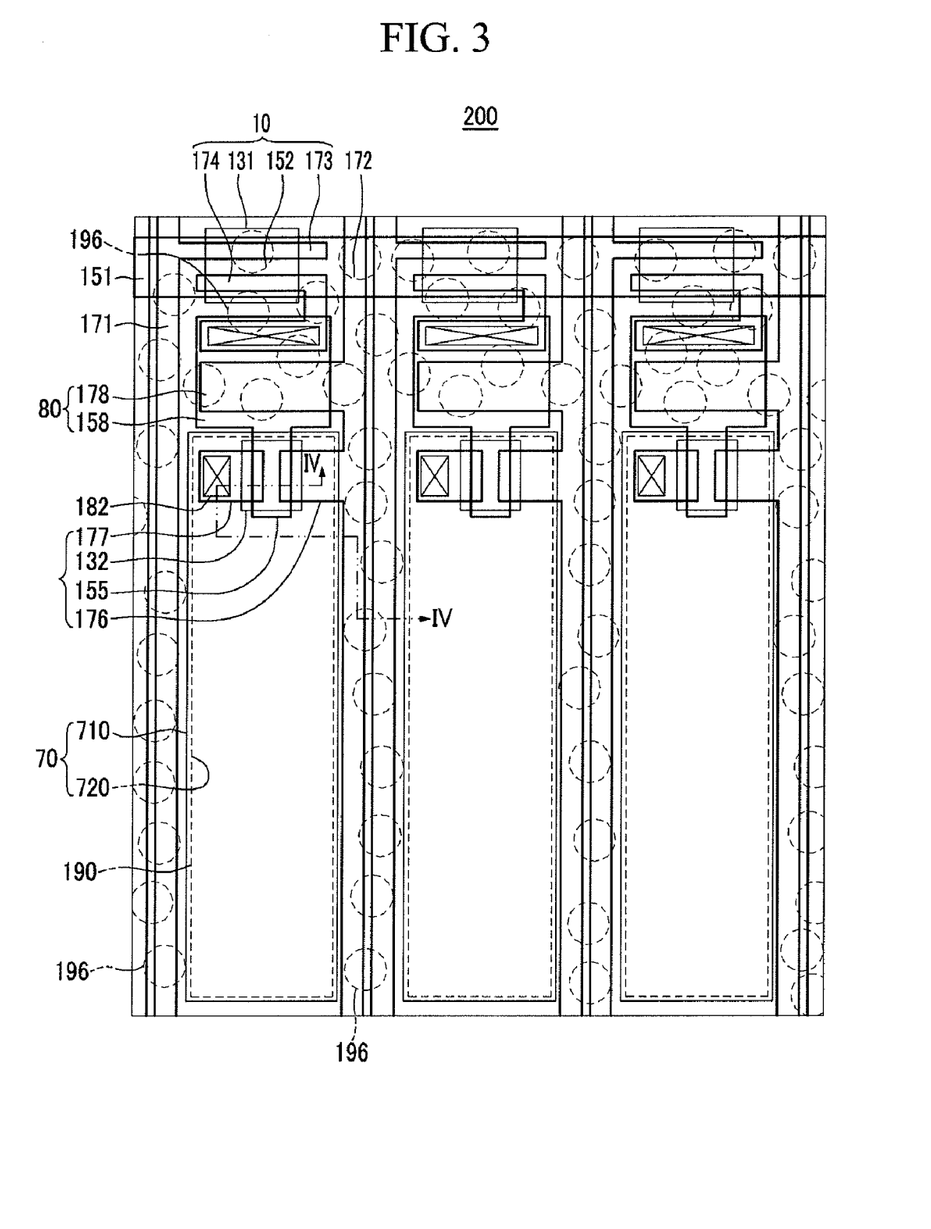
FIG. 3 is a layout view of an OLED display according to a second exemplary embodiment of the present invention.
Figure 4:
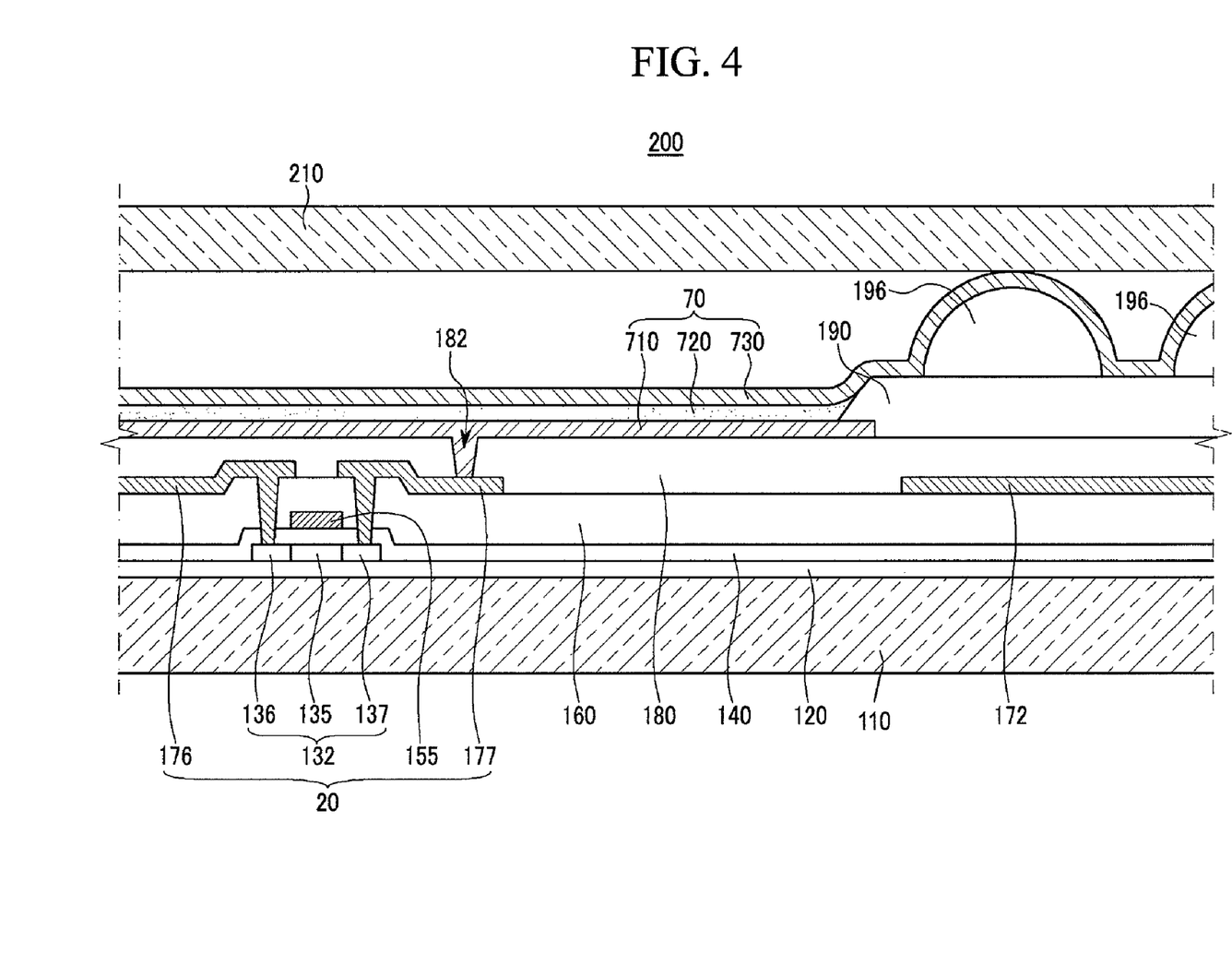
FIG. 4 is a cross-sectional view of FIG. 3, taken along the line IV-IV.

The organic emission layer 720 is made of a low-molecular organic material or a high-molecular organic material. The organic emission layer 720 can be formed in a multi-layer structure that includes a hole injection layer (HIL), a hole transport layer (HTL), an emission layer, an electron transport layer (ETL), and an electron injection layer (EIL). The HIL may be disposed on the pixel electrode 710, which is a positive electrode, and the HTL, the emission layer, the ETL, and the EIL may then be sequentially stacked thereon. Another embodiment will now be described with reference to FIG. 3 and FIG. 4. As shown in FIG. 3 and FIG. 4, an OLED display 200 may include a plurality of light scattering spacers 196. These light scattering spacers 196 may have various shapes, such as a hemisphere and a hemispheroid. In addition, the light scattering spacers 196 may be irregularly distributed on a pixel defining layer 190. Accordingly, the light scattering spacer 196 may be highly effective in scattering external light reflected to the conductive layer 172 disposed thereunder, and thus, substantially suppress the reflection of the external light.

Figure 5:
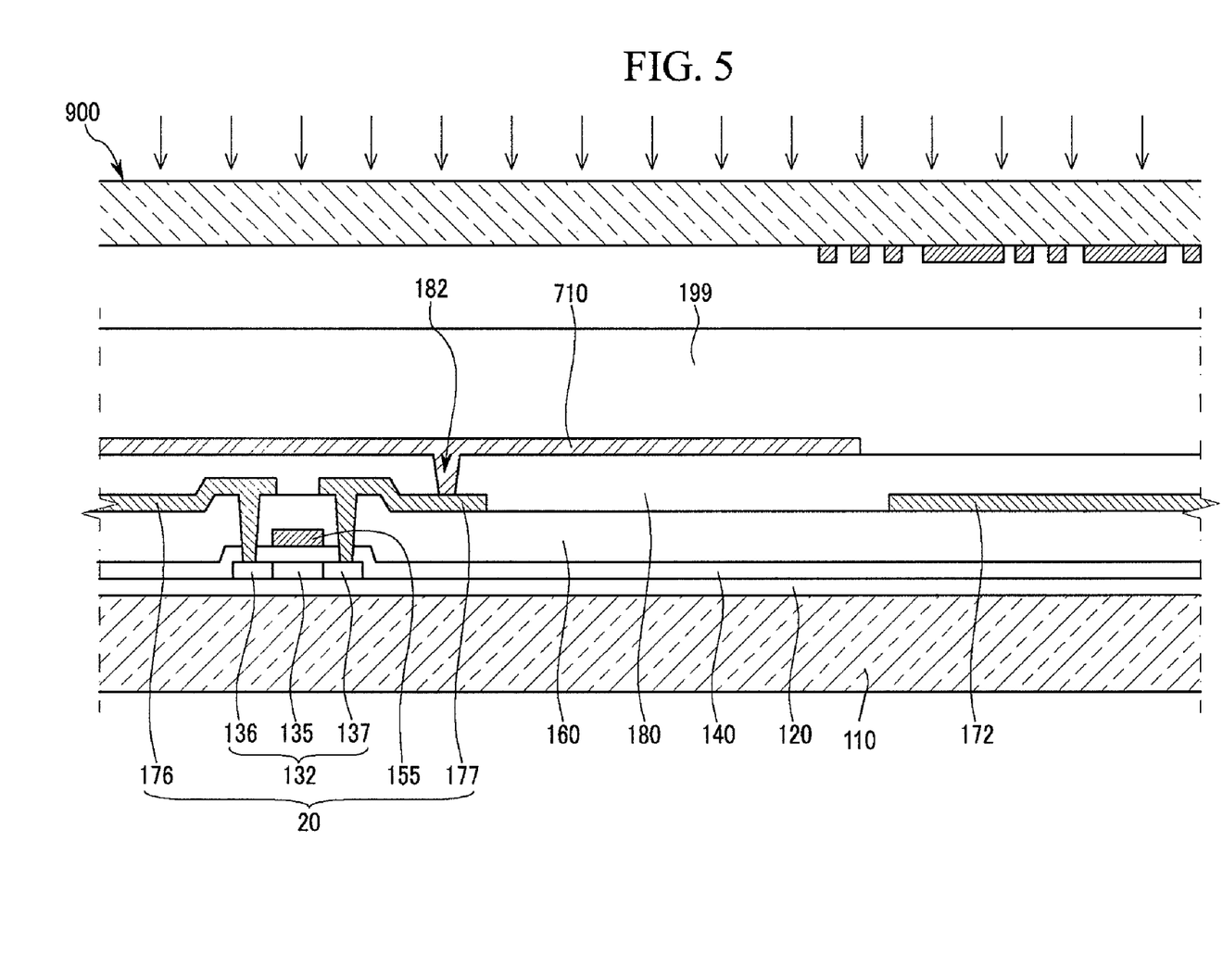
FIG. 5 and FIG. 6 are sequential cross-sectional views of a manufacturing process of the OLED display shown in FIG. 1.

A manufacturing method of the OLED display will now be described with reference to FIG. 5, and FIG. 6. As shown in FIG. 5, a thin film transistor 20 may include a gate electrode 155, a source electrode 176, and a drain electrode 177. The thin film transistor 20 is formed on a substrate member 110 that includes a plurality of pixel areas. A planarization layer 180 covers the thin film transistor 20. A contact hole 182 is also formed to partially expose the drain electrode 177. Subsequently, a pixel electrode 710 is formed through this contact hole 182 and is connected to the drain electrode 177 of the thin film transistor 20.

Next, a photo-sensitive material layer 199 is coated on the planarization layer 180 and the pixel electrode 710. A half-tone exposure process is then performed by using a mask 900. The mask 900 can selectively control transmission of light by using various known methods, including using a slit pattern. Accordingly, the photo-sensitive material layer 199 is selectively exposed as desired.

Figure 6:
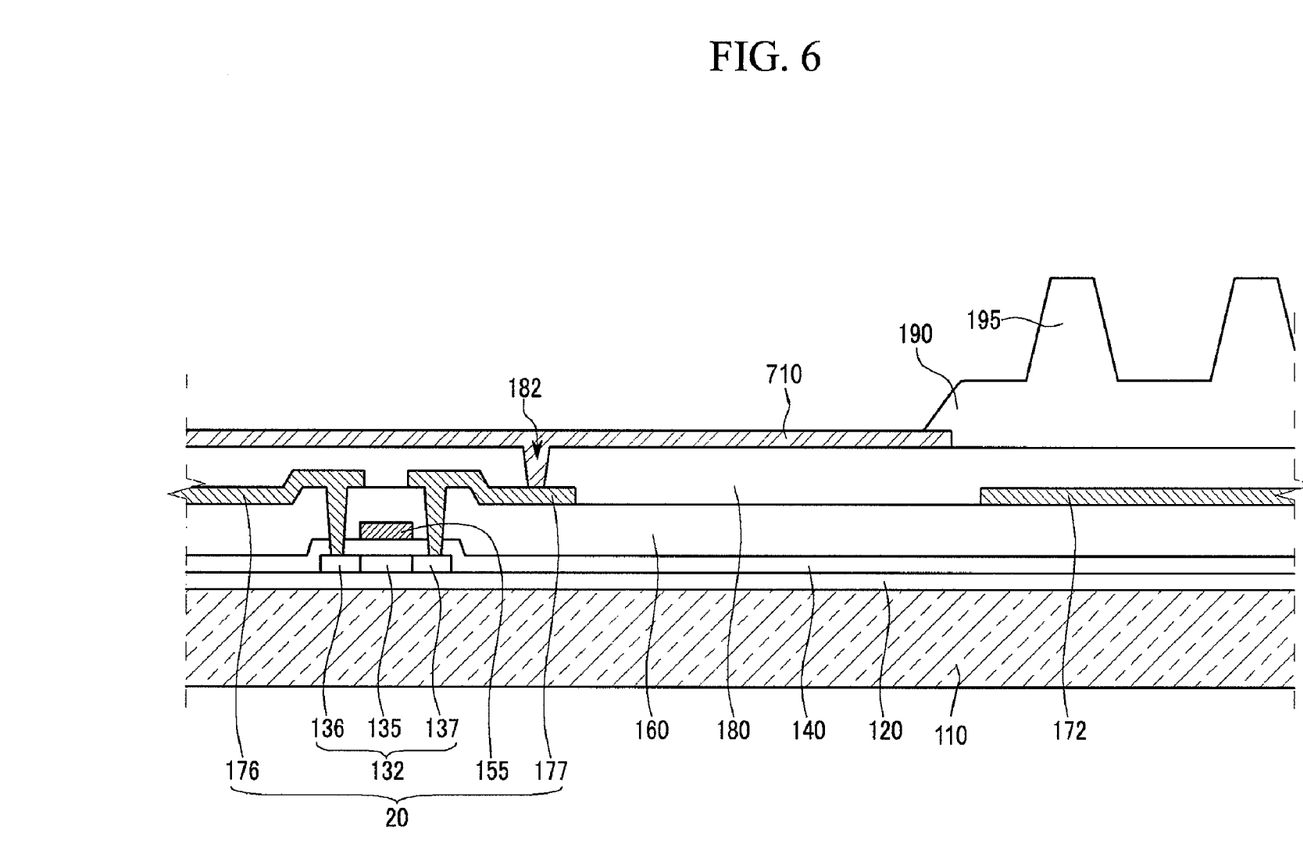

As shown in FIG. 6, a pixel defining layer 190 and a light scattering spacer 195 are formed together by developing the exposed photo-sensitive material layer 199. A plurality of light scattering spacers 195 can thus be formed in each pixel area. In addition, each of the light scattering spacers 195 may be shaped based on the light blocking pattern of the mask 900. For example, the light scattering spacers 195 may be shaped as a frustum of a pyramid, a prism, a truncated circular cone, a cylinder, a hemisphere, and a hemispheroid. Other shapes for the light scattering spacer 195 may be used in the embodiments.

Then, the organic emission layer 720 is formed on the pixel electrode 710 in the opening of the pixel defining layer 190. The common electrode 730 is also formed on the organic emission layer 720. While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
   a substrate member including a plurality of pixel areas;
   a thin film transistor (TFT) including a gate electrode, a source electrode, and a drain electrode and formed on the substrate member;
   a planarization layer formed on the TFT and having a contact hole through which the drain electrode is partially exposed;
   a pixel electrode formed on the planarization layer, and connected to the drain electrode of the TFT through the contact hole;
   an organic emission layer formed on the pixel electrode;
   a common power line formed over the substrate member and at least partially covered by the planarization layer;
   a common electrode formed on the organic emission layer and comprising a plurality of curved portions at least two of which are formed substantially directly above the common power line;
   a pixel defining layer formed on the planarization layer and having a through opening; and
   a light scattering spacer formed on the pixel defining layer, wherein the light scattering spacer comprises a plurality of sub-spacers formed in each of the pixel areas and extending from the pixel defining layer, and wherein the sub-spacers are adjacent to and separated from each other by the curved portions of the common electrode.

2. The OLED display of claim 1, further comprising a conductive layer that is formed on the same layer as at least one of the gate electrode, the source electrode, and the pixel electrode with a same material thereof, and at least a part of the conductive layer is disposed under the light scattering spacer.

3. The OLED display of claim 2, wherein the light scattering spacer is shaped as at least one of a frustum of a pyramid, a prism, a truncated circular cone, a cylinder, a hemisphere, and a hemispheroid.

4. The OLED display of claim 2, wherein the sub-spacers are irregularly disposed in each pixel area.

5. The OLED display of claim 2, wherein each pixel area includes one pixel electrode and a plurality of light scattering spacers, and wherein a ratio of the entire bottom dimension of the sub-spacers to each pixel area is greater than 30% of a ratio of an area of the pixel defining layer to the pixel area.

6. The OLED display of claim 5, wherein a bottom dimension of one sub-spacer is in a range between 1% to 20% of the ratio of the area of the pixel defining layer to the pixel area.

7. The OLED display of claim 1, further comprising a sealing member disposed facing the substrate member with the thin film transistor interposed therebetween, wherein the light scattering spacer maintains a distance between the substrate member and the sealing member.

8. The OLED display of claim 7, wherein the light scattering spacer is integrally formed with the pixel defining layer with a same material as the pixel defining layer.

9. The OLED display of claim 1, wherein at least two of the sub-spacers are located substantially directly above the common power line.

10. A manufacturing method of an organic light emitting diode (OLED) display, comprising:
    forming a thin film transistor (TFT) that includes a gate electrode, a source electrode, and a drain electrode on a substrate member that includes a plurality of pixel areas;
    forming a planarization layer that covers the TFT and has a contact hole through which the drain electrode is partially exposed;
    forming a pixel electrode connected to the drain electrode of the TFT through the contact hole on the planarization layer;
    forming an organic emission layer on the pixel electrode;
    forming a common power line over the substrate member to be at least partially covered by the planarization layer;
    forming a common electrode on the organic emission layer, wherein the common electrode comprises a plurality of curved portions at least two of which are formed substantially directly above the common power line;
    coating a photo-sensitive material layer on the planarization layer and the pixel electrode; and
    forming a pixel defining layer by patterning the photo-sensitive material layer with a photolithography process using a mask on the planarization layer and simultaneously forming a light scattering spacer on the pixel defining layer, the pixel defining layer having an opening through which the pixel electrode is exposed, wherein light scattering spacer comprises a plurality of sub-spacers formed in each of the pixel areas and extending from the pixel defining layer, and wherein the sub-spacers are adjacent to and separated from each other by the curved portions of the common electrode.

11. The manufacturing method of claim 10, wherein the photolithography process comprises a half-tone exposure process.

12. The manufacturing method of claim 10 wherein the light scattering spacer is shaped as at least one of a frustum of a pyramid, a prism, a truncated circular cone, a cylinder, a hemisphere, and a hemispheroid.

13. The manufacturing method of claim 10, wherein at least two of the sub-spacers are located substantially directly above the common power line.

* * * * *